(12) United States Patent
Clark et al.

(10) Patent No.: US 6,169,662 B1
(45) Date of Patent: Jan. 2, 2001

(54) EJECTION SYSTEM AND METHOD FOR ON LINE REMOVAL OF EDGE CONNECTOR CARDS

(75) Inventors: Thomas J. Clark, Lunenburg, MA (US); Alisa C. Sandoval, Grass Valley, CA (US)

(73) Assignee: Hewlett-Packard Company, Palo Alto, CA (US)

( * ) Notice: Under 35 U.S.C. 154(b), the term of this patent shall be extended for 0 days.

(21) Appl. No.: 08/957,221

(22) Filed: Oct. 24, 1997

(51) Int. Cl.$^7$ ...................................... H05K 5/00
(52) U.S. Cl. ...................... 361/754; 361/752; 361/753; 361/754; 361/756; 361/759; 361/796; 361/797; 361/798; 361/799; 206/706; 211/41.17; 211/216
(58) Field of Search ................... 361/752–754, 361/796–799; 206/706; 211/41.17, 216

(56) References Cited

U.S. PATENT DOCUMENTS

| | | | |
|---|---|---|---|
| 4,603,375 | * 7/1986 | Miller et al. | 361/399 |
| 4,758,928 | * 7/1988 | Wierec et al. | 361/415 |
| 5,265,328 | 11/1993 | Gorman | 29/829 |
| 5,400,214 | 3/1995 | Antonuccio et al. | 361/683 |
| 5,544,006 | 8/1996 | Radloff et al. | 361/683 |
| 5,590,023 | 12/1996 | Hernandez et al. | 261/683 |
| 5,801,926 | * 9/1998 | Cutsforth et al. | 361/754 |

FOREIGN PATENT DOCUMENTS

| | | | |
|---|---|---|---|
| 0 293 215 | 11/1988 | (EP) | H05K 7/14 |
| 2 088 140 | 6/1982 | (GB) | H05K 7/20 |
| 07212061 | 8/1995 | (JP) | H05K 7/14 |
| 09097987 | 4/1997 | (JP) | H05K 7/14 |
| WO 93/20673 | 10/1993 | (WO) | H05K 1/14 |

OTHER PUBLICATIONS

"Option Card Retainer", IBM Technical Disclosure Bulletin, US, IBM Corp., New York, vol. 31, No. 6; Nov. 1, 1988, pp. 251–252.

* cited by examiner

Primary Examiner—Leo P. Picard
Assistant Examiner—Tuan Dinh
(74) Attorney, Agent, or Firm—Denise A. Lee (57) ABSTRACT

The card removal method and system easily removes a PCA card from a powered on computer system while minimizing damage to the computer system and to the individual removing the PCA. The printed circuit assembly card removal system is comprised of: an ejection card including at least a first ejector extending from the surface of the ejection card, the ejector having a first surface for pressing against the edge of the PCA card to be removed, and an ejection card holder for mechanically supporting the ejection card. To remove the PCA, the ejection card is pulled outward causing the ejector to apply a force to the edge of the PCA card to be removed, forcing the card edge fingers of the PCA card out of the PCA connector.

24 Claims, 11 Drawing Sheets

EJECTION SYSTEM AND METHOD FOR ON LINE REMOVAL OF EDGE CONNECTOR CARDS

BACKGROUND OF THE INVENTION

Computer systems typically include a computer chassis which houses a plurality of printed circuit board assemblies (PCAs) which are electrically coupled to each other. During the lifetime of the computer system, it is often necessary to add, replace or remove a PCA from another PCA, i.e. the system PCA, see FIG. 1. For example, a particular PCA may be defective or an older version of a PCA may need to be replaced with an updated version of the PCA card that has more powerful features. To prevent system disruption, oftentimes it is preferable to remove the PCA card while the remainder of the PCA cards in the computer system backplane are powered on.

Unfortunately, PCA card removal is not always easy. The backplane PCA connector which receives the edge of the individual PCA card, often has a high extraction force for PCA card removal. Although this high extraction force (1) helps prevent accidental removal of the PCA card and (2) helps to provide solid mechanical and electrical connection of the PCA to the computer system, the high extraction force makes PCA card extraction difficult. The difficult removal of the PCA card is exacerbated by the fact that PCA cards are often closely spaced giving the system user removing the PCA card little room for maneuverability.

Often, because of the problems associated with removing the PCA card, the system user drops or scrapes the PCA against a neighboring PCA. In a powered down computer system, dropping the PCA against a neighboring PCA can cause component damage. In a powered on system, dropping or scraping of the PCA against a neighboring PCA can cause electrical shorting.

Another problem resulting from the difficulties in removing PCA is the incidence of scrapes or cuts to the fingers of the individual removing the PCA. Current PCA manufacturing processes result in sharp component leads. Because of the high force required to remove the PCA, it is difficult for the system technician to maintain his or her hand position and frequently the hand position of the technician removing the PCA will slip to coincide with a sharp edge of the component lead. This slippage often results in a scrape or cut on the fingertips of the individual attempting to remove the PCA card.

A method for removing PCA cards which allows for the easy removal of an individual PCA card in a powered-on computer system while minimizing the damage (1) to the PCA cards remaining in the system and (2) to the individual removing the PCA card is needed.

SUMMARY OF THE INVENTION

The present invention provides a system and method for providing easy removal of a PCA card from a powered on computer system while minimizing the risk of damage to the computer system and the risk of injury to the individual removing the PCA card. The printed circuit assembly card removal system is comprised of: an ejection card including at least a first ejector extending from the surface of the ejection card, the ejector having a first surface for pressing against the edge of the PCA card to be removed, and an ejection card holder for mechanically supporting the ejection card. Preferably, the ejection card holder further includes at least one ejection card stop which controls the travel distance of the ejection card and which prevents the ejection card from becoming accidentally disengaged from the ejection card holder.

In the preferred embodiment, the card removal system includes a pair of spaced apart ejectors and a pair of spaced apart ejection card stops. Typically an ejection card holder is placed on each side of the PCA connector for the card to be removed. Each ejection card holder includes a recess for holding an ejector and a recess for holding an ejection card stop.

The ejector pair and ejection card stop pair of the ejection card are installed in the ejection card holders before the PCA card is removed. Since the width of the ejection card holder is preferably less than the width of the PCA connector into which the PCA card is inserted, the first surface of the ejector is behind the edge of the PCA card to be removed.

After the ejection card has been installed into the ejection card holder, the PCA card (that is eventually to be removed) is inserted into a PCA connector. To remove the ejection card, the system technician pulls outwardly on the ejection card grip away from the ejection card, the system technician pulls outwardly on the ejection card grip away from the ejection card holders. When the ejection card is pulled outward, the ejector applies a force to the edge of the PCA card to be removed, forcing the card edge fingers of the PCA card to become disengaged from the PCA connector. Typically, the ejection card will drop downward onto the surface of the ejection card where it can be easily removed.

Because each PCA card has a corresponding ejection card that is positioned underneath it, typically when a PCA card is removed, the PCA card drops onto the ejection card located beneath it. Thus an ejection card physically separates the PCA to be removed from its neighboring PCA card, preventing mechanical damage to its neighboring PCA card. For an on line replacement of a PCA card, the system is powered on, but the particular PCA card that is being added or removed may be powered on or may be powered off. Because the ejection card is typically comprised of an insulator, each ejection card prevents the electrical shorting out that occurs in conventional system when a PCA comes into physical contact with its neighboring PCA. Thus, the ejection card prevents the mechanical damage or electrical shorting that can occur when the PCA board is removed from a powered on system.

In the card removal system taught by the present invention, the PCA is removed by pulling outward on the card grips of the ejection card instead of pulling outward on the PCA card targeted for removal. Gripping the ejection card instead of the PCA card solves the problem of injuries from component leads which occurs when an individual tries to remove a PCA card from a conventionally configured system. Another advantage of removing the PCA card using the ejection card is that the individual trying to remove the PCA no longer has to try and squeeze his fingers between PCA cards, a space of limited maneuverability.

Another advantage of the present invention is improved alignment of the PCA card. The preferred embodiment of the card removal system includes a plurality of alignment pins that extend from the sidewall of the computer system chassis adjacent to the PCA bulkhead. The alignment pins help facilitate the proper alignment of the PCA card on insertion and upon removal. On insertion the system technician simply slides a groove formed in the PCA bulkhead over the alignment pins to assist in proper positioning of the PCA card. When removing the PCA card, the alignment pin helps keep the PCA card from rotating during removal. This is especially important when a short PCA card, a PCA card that extends only the length of the PCA connector, is removed.

A further understanding of the nature and advantages of the invention described herein may be realized by reference to the remaining portion of the specification and the attached drawings.

DETAILED DESCRIPTION OF THE PREFERRED EMBODIMENTS

Figure 1:
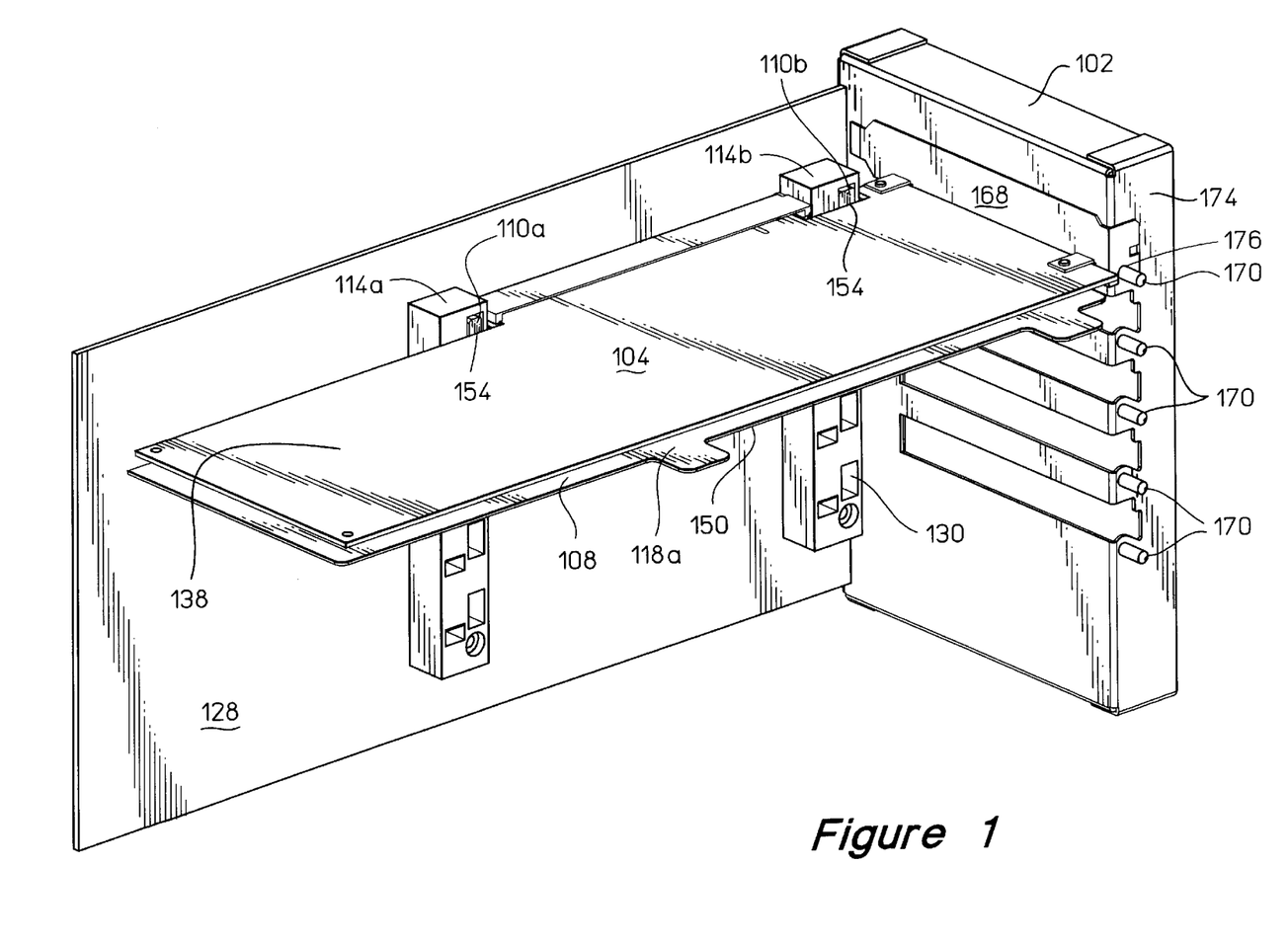
FIG. 1 is a right front side view of a partial computer system chassis populated by a single PCA installed into a backplane, an ejection card and two ejection card holders according to the present invention.

The present invention provides a system and method for removal of a PCA card from either a powered on or powered off computer system. FIG. 1 shows a right front side view of a partial computer system chassis 102 that houses a single printed circuit board assembly 104. The printed circuit assembly card removal system 106 is comprised of: an ejection card 108 including at least a first ejector 110a extending from the ejection card 108, the at least first ejector 110a having a first surface, and an ejection card holder 114a for supporting the ejection card 108.

Figure 2:
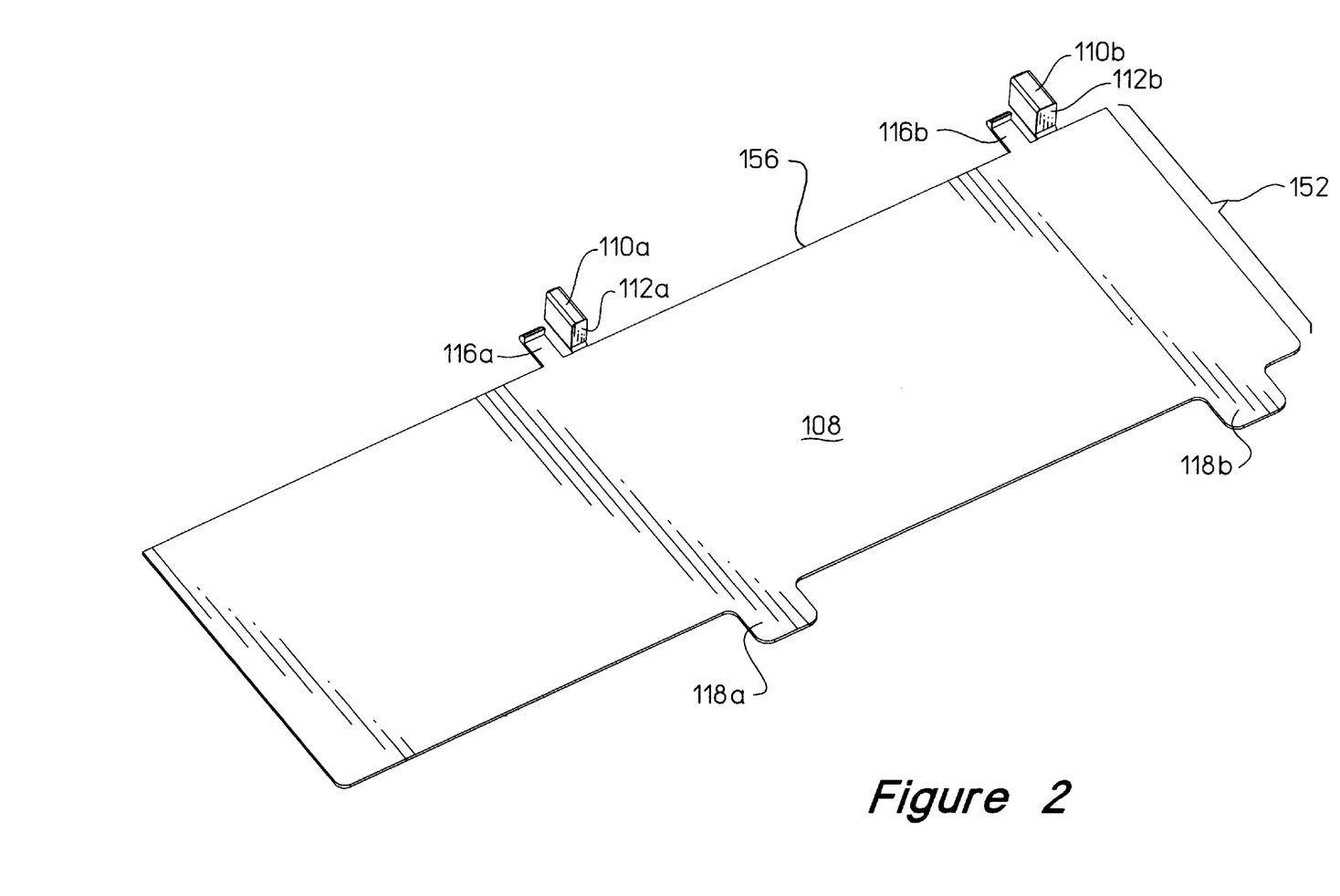
FIG. 2 is an isometric view of an ejection card according to the present invention.

FIG. 2 is an isometric view of an ejection card 108 according to the preferred embodiment of the present invention. In the preferred embodiment, the ejection card 108 includes a pair of ejectors 110a, 110b, a pair of ejection card stops 116a, 116b, and a pair of ejection card grips 118a, 118b. The ejectors 110a, 10b apply a force to the edge of the PCA to be removed. The ejection card stops 116a, 116b control the travel distance of the ejection card 108 and prevent the accidental removal of the ejection card 108 from the ejection card holders. The ejection card grips 118a, 118b provide an easily accessible gripping surface which prevents injury to the system technician removing the PCA card.

Figure 3:
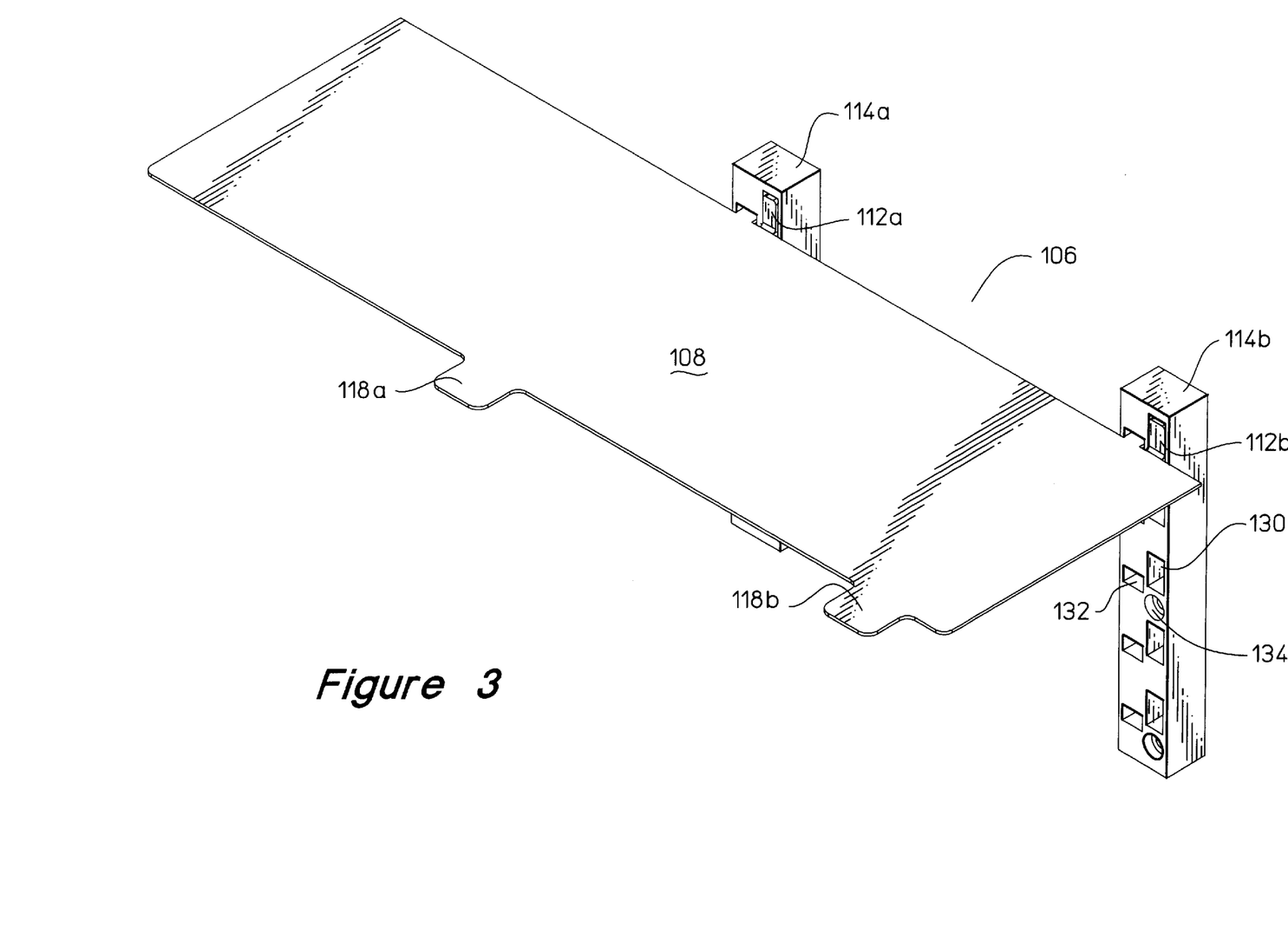
FIG. 3 is an isometric view of an ejection card inserted into two ejection card holders according to the present invention.
Figure 4:
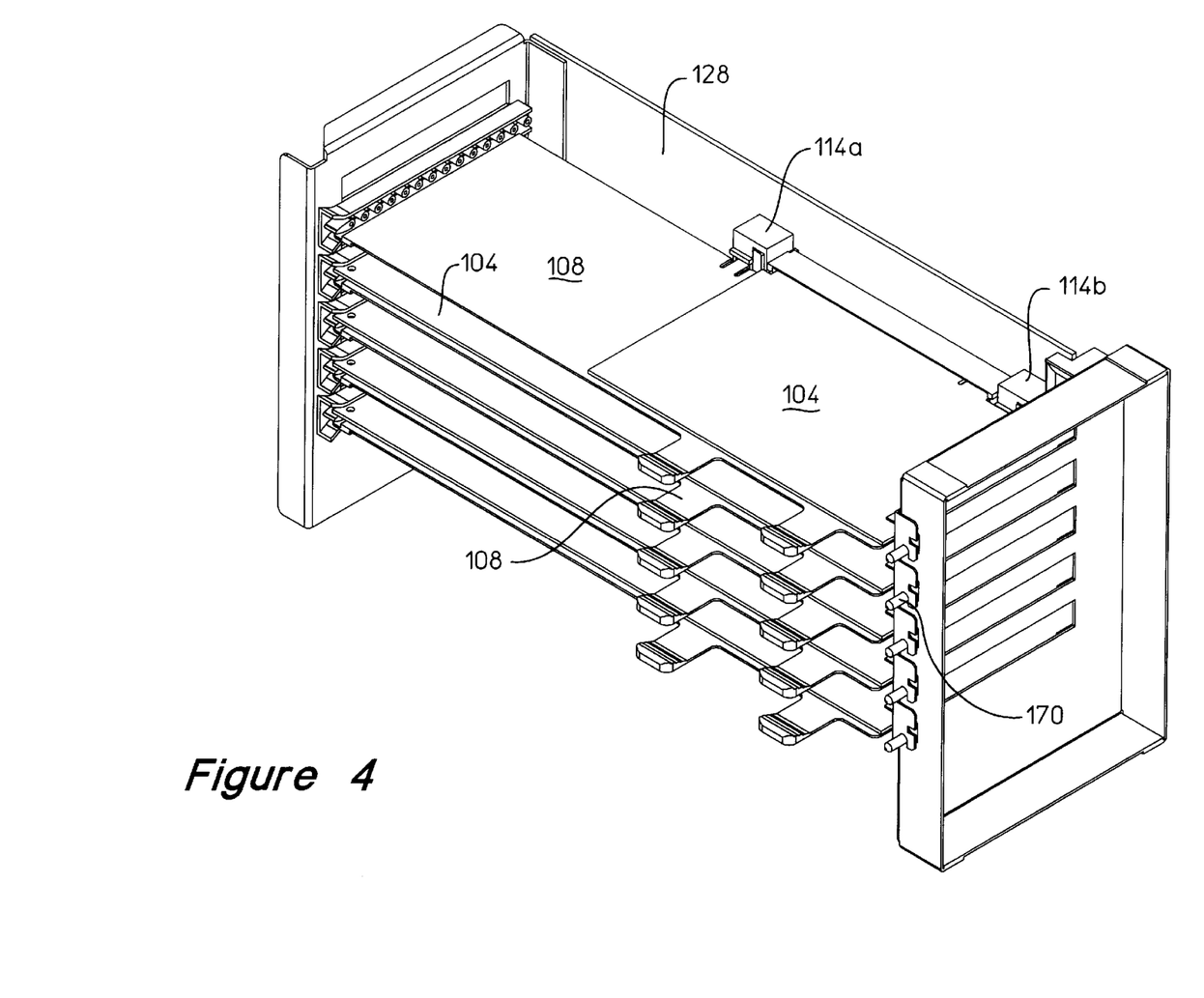
FIG. 4 is a left front view of a partial computer system chassis according to the present invention.

Referring to FIG. 3 shows an isometric view of an ejection card inserted into a pair of ejection card holders 114a, 114b. FIG. 4 shows a front view of a partial computer system chassis 102. In the preferred embodiment, there are two ejection card holders 114a, 114b, one on either side of the PCA system connector 124. Preferably, the ejection card holders 114a, 114b are made of plastic using an injection molding process and include a plurality of recesses that extend at least partially through the ejection card holders 114a, 114b. The recesses of the ejection card holders support the ejection card, but also act to keep the ejection card aligned while it is being pulled outward during the PCA card removal.

Referring to FIG. 4 shows a partial computer chassis where the front wall, bottom wall and top wall of the computer system chassis are not shown. As in conventional computer systems a plurality of PCA connectors are positioned on the backplane 128 of the computer system chassis. Although separate ejection card holder pairs 114a, 114b could be used to support each individual ejection card 108 installed in the card removal system, in the preferred embodiment shown in FIG. 4, a single ejection card holder pair 114a, 114b is used to support several ejection cards. Thus in the preferred embodiment, each ejection card holder is a unitary structure that extends from the uppermost PCA connector to the lowermost PCA connector. Each ejection card holder includes recesses for each ejection card.

Preferably, each ejection card holder 114 has three types of recesses: a recess for supporting the ejector 130, a recess for supporting the ejection card stop 132, and an attachment recess 134. Preferably, the shape of the ejector recess 130 is substantially rectangular to match the shape of the ejector. The ejector recess 130 should be slightly larger than the ejector 110 to allow the ejector 110 to slide easily into and to be easily pulled out of the ejector recess 130. Similarly, the recess for the ejection card stop 132 is also substantially rectangular and slightly larger than the ejection card stop 116.

The third type of recess, the attachment recess 134, is used to attach the ejection card holder 114 to the backplane 128 of the PCA chassis. In the embodiment shown in FIG. 3, the attachment recess 134 is substantially circular and extends through the ejection card holder 114. A screw inserted through the ejection card recess is used to secure the ejection card holder 114 to the backplane 128 of the chassis. Although the embodiment shown in FIG. 1 is preferred, other means of attaching the ejection card holder to the computer system chassis, such as attaching the ejection card holder using an adhesive, may also be used.

Referring to FIG. 1, the ejection card 108 is supported so that it is substantially parallel to a first major surface 138 of the PCA 104. For PCA cards that extend the entire length of the chassis, in addition to being supported by the ejection card holder 114, the ejection card 108 is also supported by an ejection card guide on the left hand side of the interior computer system chassis.

Figure 5A:
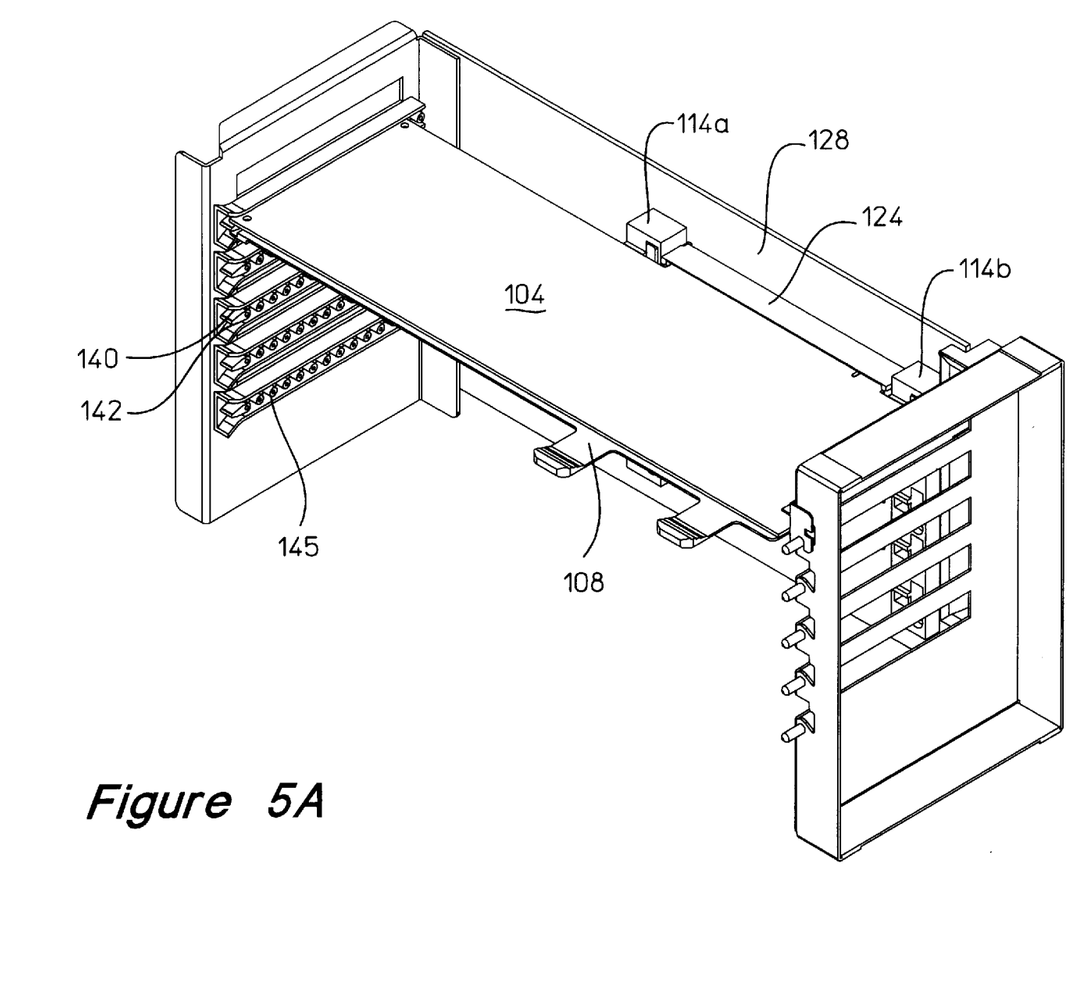
FIG. 5A is a left front view of a partial chassis populated by a long PCA.
Figure 5B:
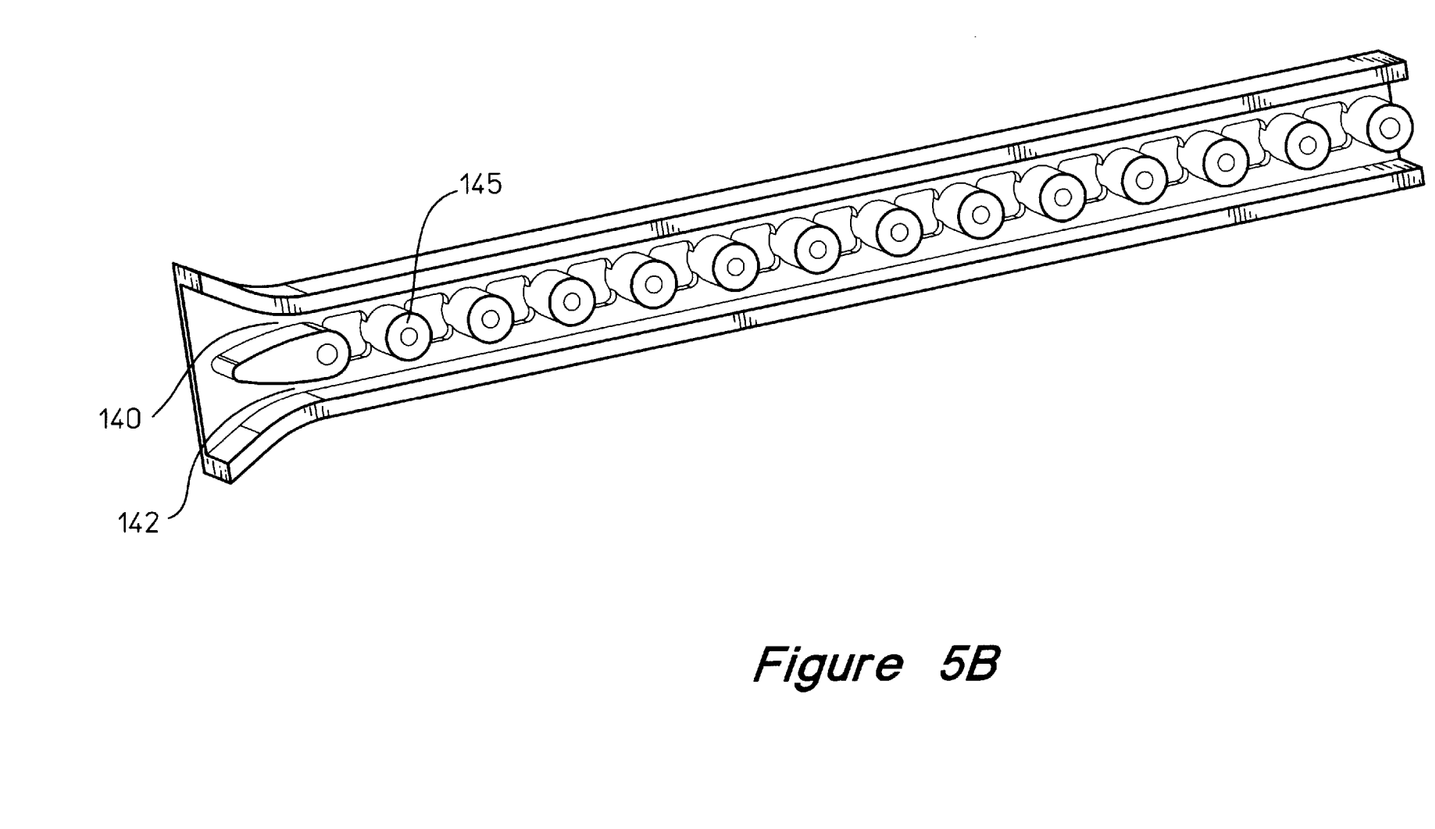
FIG. 5B shows a detailed view of the card guide shown in FIG. 5A.

FIG. 5A shows a left front view of the interior of the sidewall of a computer system chassis after insertion of the ejection card and PCA. FIG. 5B shows a detailed view of the card guide shown in FIG. 5A. Although card guides have been used in the past to support PCA board in a computer chassis, the present invention further includes a card guide for supporting an ejection card. Referring to FIGS. 5A and 5B, show a first card guide 140 for supporting a PCA and a second card guide 142 for supporting an ejection card. Typically the card guide for both the PCA and the ejection card are formed from a unitary plastic structure that is attached to the chassis body. Preferably, a plurality of air flow vents 145 are formed in the region between the first card guide and the second card guide to improve air flow in the chassis. To further improve air flow in the chassis, the sidewall areas above and below the PCA and ejection card guides is open.

For easy insertion of the ejection card 108 into the ejection card guide 142, the thickness of the edge of the ejection card should be less than the distance between the sidewalls of the ejection card guide. In an alternative embodiment of the present invention there is an indentation along the left hand side of the ejection card. This indentation allows the ejection card 108 to slide easily between the sidewalls of the ejection card guide 142.

Referring to FIG. 1 shows a PCA card and an ejection card that is positioned underneath it. Typically a PCA card that is removed by pulling outward on the ejection card falls onto the ejection card that is located beneath it. Because the ejection card physically separates the PCA to be removed from its neighboring PCA card, the ejection card prevents the PCA card droppage from mechanically damaging its neighboring PCA card. Because the ejection card is typically made of plastic, it also prevents damage due to electrical shorting that can occur when the PCA board is removed from a powered on system.

In the preferred embodiment, the ejection card 108 is formed from an insulative material, preferably a plastic, and is manufactured using an injection molding process. Although preferably the entire ejection card is made of an insulator, in a first alternative embodiment the ejection card may be comprised of more than one material. In one alternative embodiment, only the first surface of the ejection card 150 facing the PCA card to be removed is formed from an insulative material. In a system with more than one PCA installed, surface 138 is preferably also an insulative.

Figure 6A:
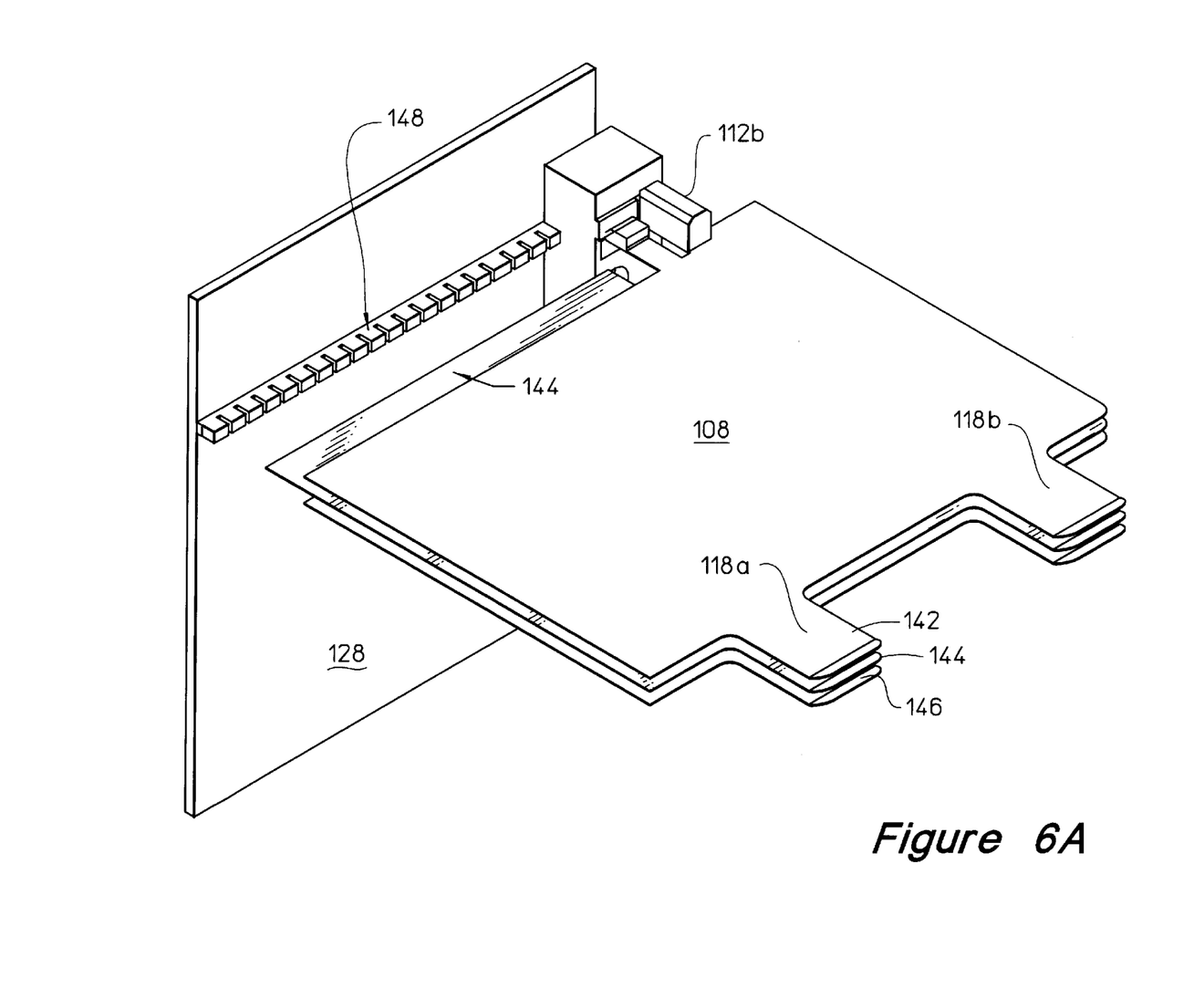
FIG. 6A shows a partial backplane and partial card removal system before insertion of the alternative ejection card.

In another alternative embodiment, the ejection card 108 is comprised of a first insulative layer 142, a second insulative layer 146, and a conductive layer 144 positioned between the first and second insulative layers 142, 146. Referring to FIG. 6A shows a partial backplane and partial PCA card removal system before insertion of an ejection card 108 according to an alternative embodiment. In FIG. 6A, the ejection card is exploded to more clearly show the first insulative layer 142, the second insulative layer 146, and the conductive layer 144.

Figure 6B:
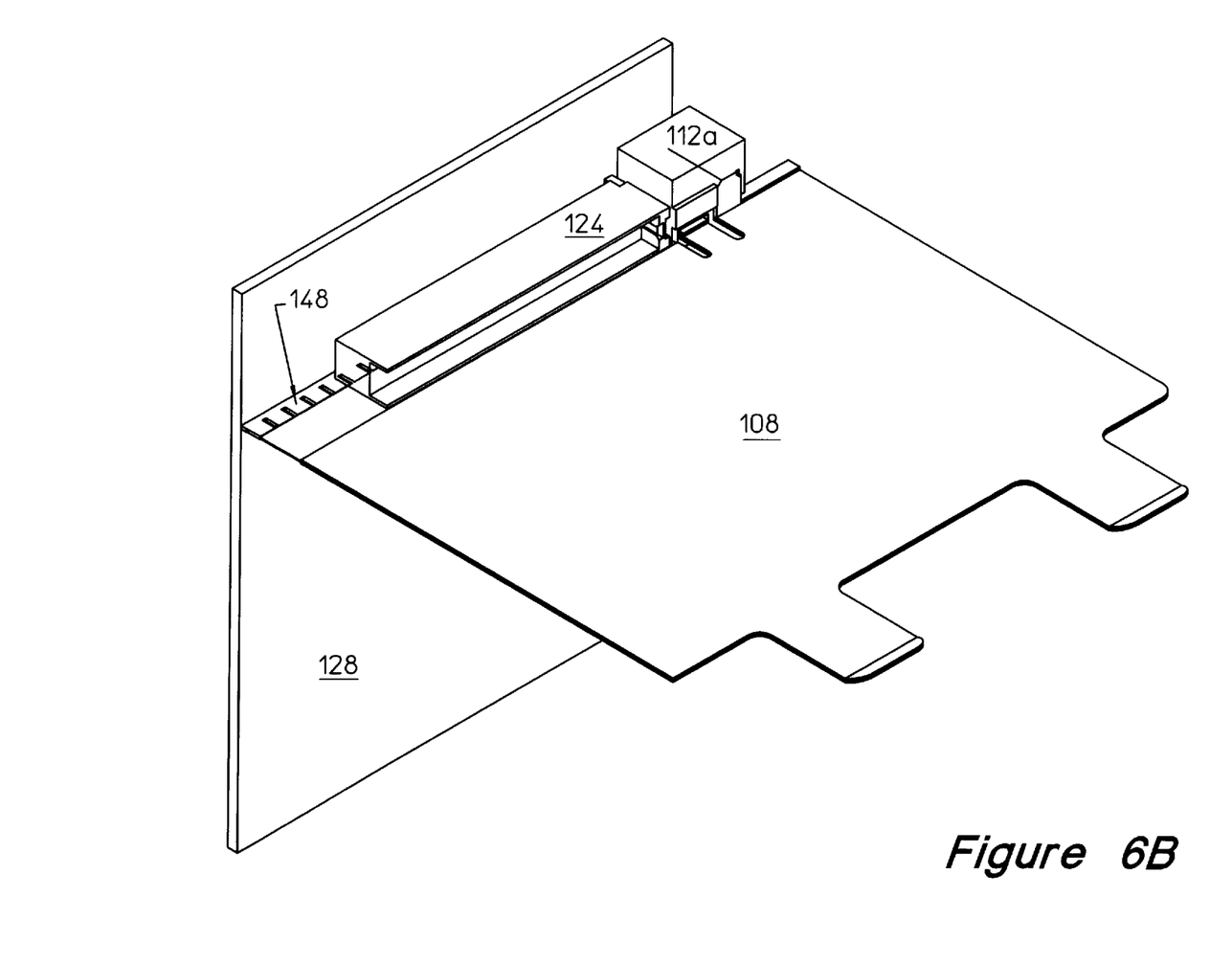
FIG. 6B shows a partial backplane and partial card removal system after insertion of the alternative ejection card.

FIG. 6B shows a partial backplane and partial PCA card removal system after insertion of the alternative ejection card 108. After insertion, the conductive layer 144 of the ejection card 108 is electrically coupled to a first voltage, preferably ground. In the preferred embodiment, a conductive strip 148 is mechanically coupled to the backplane of the chassis and the conductive strip 148 is grounded to the backplane 128. The insulator/ground/insulator configuration of the ejection card provides improved EMI shielding.

In the ejection method and system taught by the present invention, the PCA is removed by pulling outward on the ejection card in the direction away from the backplane or rear wall of the computer system chassis. This is in contrast to the common removal method of pulling outward on the PCA card targeted for removal In the preferred removal system, the ejection card includes at least one, and preferably two spaced apart ejection card grips 118a, 118b protruding from the base 152 of the ejection card 108. The ejection card grips 118a, 118b facilitate the easy removal of the PCA card. In an alternative embodiment, although not preferred embodiment, the ejection card has a straight edge with no ejection card grips projecting from the ejection card base. In this embodiment, the system technician grips the edge of the ejection card to remove the PCA card.

Gripping the ejection card instead of the PCA card solves the problem of injuries from component leads which occurs when an individual attempts to remove a PCA card from a conventionally configured system. Another advantage of using the ejection card grips is that the system technician attempting to remove the PCA no longer has to try and squeeze his fingers between neighboring PCA cards, a space of limited maneuverability.

The ejection card grips 118a, 118b may be aligned so that the edges of the backplane connector and the space between the ejection card grips is approximately equal to the length of the PCA connector from which the PCA is being extracted. In addition, the ejection card grips 118 may be graded, as seen in FIG. 4, to provide an easier gripping surface. Other alternatives such as roughening the surface of the ejection card grips may also be used to provide an improved gripping surface.

Referring to FIG. 2, the ejection card 108 further includes at least one and preferably two spaced apart ejectors 110a, 110b. The ejectors 110a, 110b extend from the edge of the substantially planar base 152 of the ejection card and in the preferred embodiment are substantially rectangular in form. The ejectors 110a, 110b should be substantially rigid so as not to bend or flex substantially when the face 112a, 112b of the ejector is pressed against the edge 154 of the PCA card to be removed. When the ejection card 108 is pulled outward to remove the PCA, the first surface 112 or face of the ejector should provide a solid contact against the edge 154 of the PCA card to be removed. Preferably, the face 112 of the ejector is orthogonal to the card edge 154 to provide the maximum force to the edge of the card being removed.

When a PCA card 104 is installed in a PCA connector 124, the edges of the PCA card extends past the PCA connector. Before installation of the PCA card, the ejector pairs 110a, 110b are installed inside the ejector recesses 130a, 130b of the ejection card holder 114a, 114b so that the face 112a, 112b of the ejectors 110a, 110b are positioned behind the edge 154 of the card to be removed. The ejectors 110a, 110b are preferably positioned on either side of the PCA connector in order to apply symmetrical force to the PCA card upon removal.

In the preferred embodiment, the ejection card 108 includes at least one and preferably two ejection card stops 116a, 116b. The ejection card stops (1) limit the travel distance of the ejection card and (2) to prevent the ejection card from being accidentally removed from the ejection card holder. FIG. 2 shows ejection card before insertion into the ejection card holder. Referring to FIG. 2, the two ejection card stops 116a, 116b are formed along the back edge 156 of the ejection card 108. The ejection card stop 116 includes a first region 158, the travel section, and a second region 160, the snap. The travel section 158 limits the movement of the ejection card when removing the PCA card. The snap 160 provides an easy in hard out function that prevents the ejection card from being accidentally removed from the ejection card holder.

The travel section 158 of the ejection card stop extends from the base region of the ejection card. The travel section of the ejection card stop 116 includes a travel distance section. The travel distance section being the distance between the edge of the ejection card to the snap. When installed, the ejection card 108 will only travel the travel distance, the length the ejection card can be pulled before reaching the snap feature. Typically the travel distance is approximately ¼ inch in length and is preferably less than or equal to the thickness of the ejection card holder.

Figure 7:
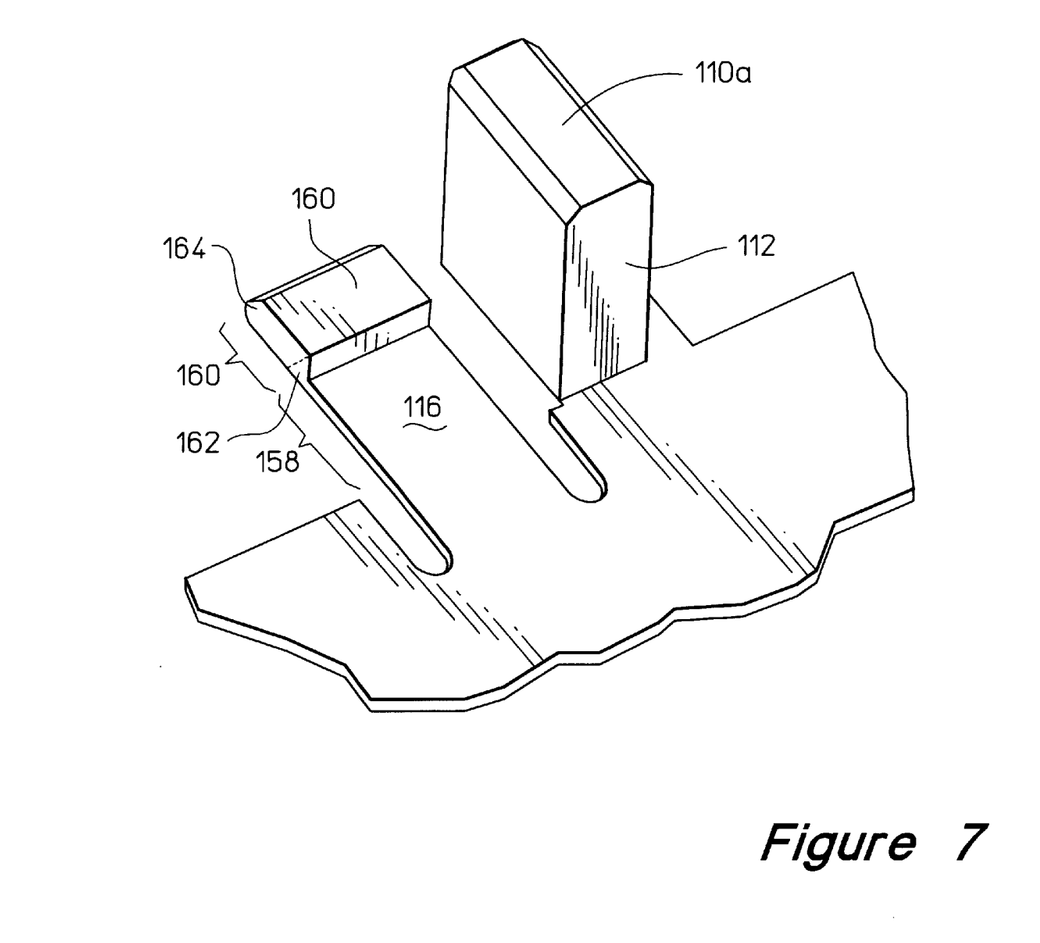
FIG. 7 shows a close up of the ejection stop feature of the ejection card

Referring to FIG. 7, shows a close up of the ejection stop feature of the ejection card. The snap 160 at the first end of the ejection card stop 116 is preferably implemented as a graded structure comprised of a first roughly triangular portion 162 and a second rectangular portion 164. The first roughly triangular portion 162 slips easily into the stop recess 130. The second rectangular portion 164 of the stop fits into the stop recess but is more difficult to remove. In the described embodiment, the snaps 160 can be removed from the ejection card holder 114 by simultaneously pulling on and depressing on the snaps of the ejection card stops to be removed. The snap 160 of the ejection card stop 116 can be depressed using a tool such as a flat blade screw driver. The ejection card stop is slightly flexible so it can bend down to install in the recess then snap up into place.

Before PCA card removal, both the ejector 110 and the ejection stop 116 portions of the ejection card 108 are inserted into their respective recesses in the ejection card holder 114. The ejection card is installed into the ejection card holder before PCA card removal, see FIG. 2, the ejector and ejection card stop reside on either side of the PCA card edge fingers. When the ejection card is pulled outward, the force applied by the ejector of the ejection card removes the edge connector fingers of the PCA card from the PCA connector, allowing the PCA card to be easily reached and removed. However, because of the ejection card stop, the ejection card will not move beyond its travel distance and will remain captive in the ejection card holder.

FIG. 5 shows a right front side view of a partial computer system chassis. Preferably, the computer system chassis 102 has a generally rectangular shape and includes a front wall (not shown), a rear wall, opposing sidewalls, a bottom wall (not shown) and a top wall (not shown). FIG. 1 shows a PCA card after insertion of the PCA card into its connector. As in conventional computer systems, there are a plurality of card connectors attached to the rear wall which interconnect to form the system backplane PCA. The card edge fingers of each PCA card fits into its corresponding card connector. Further, each PCA card is typically attached to a bulkhead 168 which provides electromagnetic interference protection (EMI) for the PCA card.

To connect the PCA card to its corresponding PCA connector, the system user slides the PCA card into place. In the preferred embodiment of the present invention, a plurality of alignment pins 170 extend from a first surface of the sidewall 174 of the computer chassis (see FIG. 1). The alignment pins 170 help facilitate the proper alignment of the PCA card on insertion and upon removal. Typically, a groove 176 that matches the shape or curvature of the alignment pins is formed in the PCA bulkhead. Thus, on PCA insertion the system technician simply slides the groove 176 of the PCA bulkhead 168 over the alignment pins to assist in proper positioning of the PCA card. During removal of the PCA, the alignment pins 170 also ensure that the PCA ejects out straight rather than being able to rotate When removing the PCA card, the alignment pins 170 helps keep the PCA card from rotating during removal. This is especially important when a short PCA card, a PCA card that only extends the full length of the PCA connector is removed. Referring to FIG. 4 shows a partial right isometric view of the present invention with the computer system chassis populated by a short PCA card. In the embodiment shown in FIG. 4, only one ejector 110a pushes against the PCA card during card ejection. Applicant believes that rotational forces are caused both from pulling from the PCA connector and pushing from only one ejector. The alignment pin helps to insure that the short PCA card ejects out straight rather than rotating.

Figure 8:
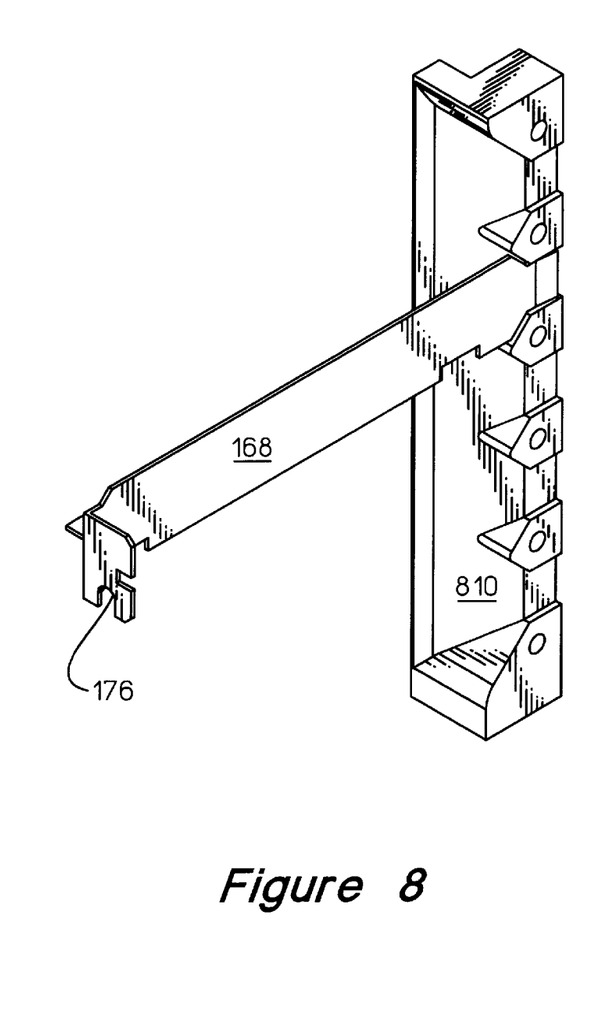
FIG. 8 shows the card corner aligners according to the present invention.

In addition to the alignment pins, in an alternative embodiment a PCA card corner aligner facilitates the insertion and removal of the PCA card. Referring to FIG. 8 shows a PCA corner aligner 810. The card corner aligner 810 is positioned in the corner formed by the bulkhead and rear wall. Preferably, the corner aligner is sloped so that the thickness of the corner aligner increases the further you move away from the corner where the bulkhead and rear wall meet. Thus, when the system technician sliding the PCA cards and PCA card bulkhead into its proper slot on the computer system chassis, the bulkhead of the PCA card tends to slide into the corner, the proper aligned position.

Figure 9:
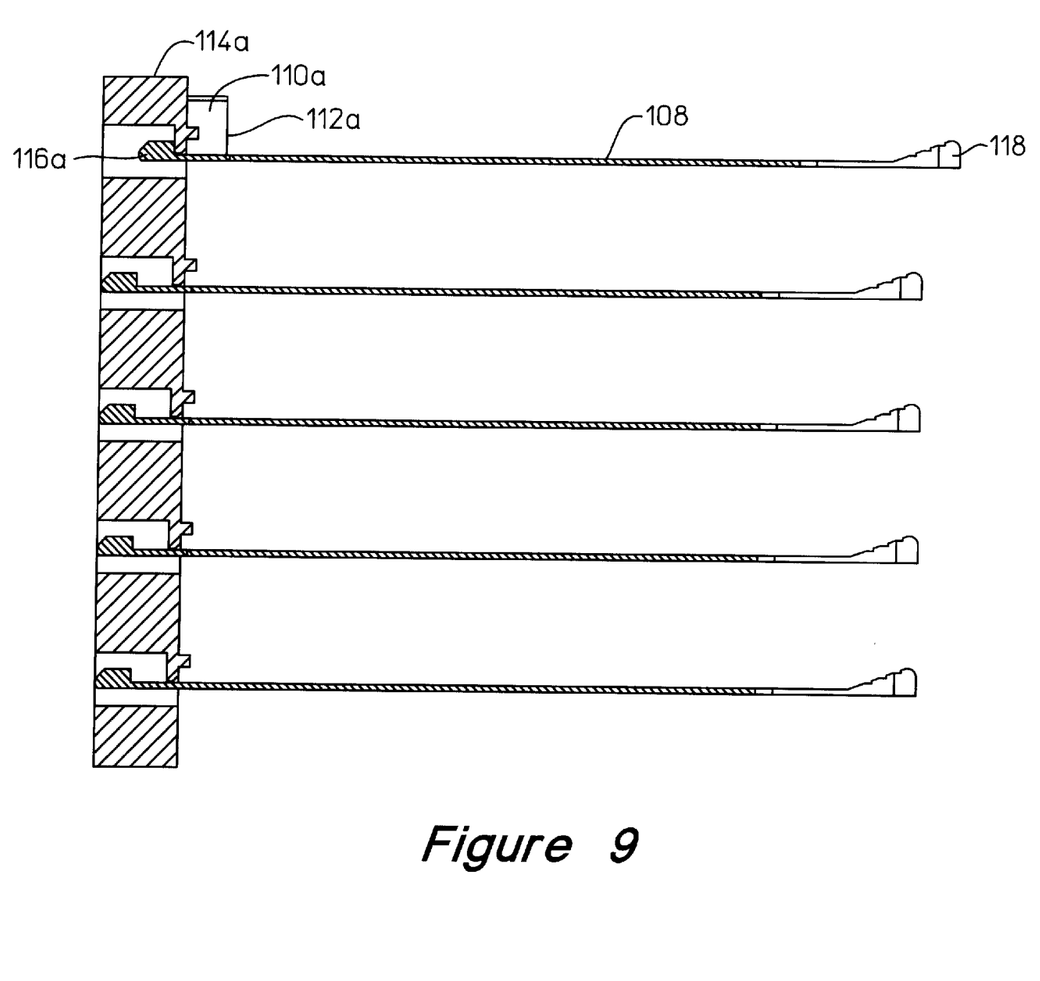
FIG. 9 shows a side cross-sectional view of the ejection card holder after insertion of the ejection card stop.

FIG. 9 shows a side cross-sectional view of the ejection card holder after insertion of the ejection card stop. The uppermost ejection card has been pulled outward so that the ejector is moved outside of the ejection card holder. As the ejection card is pulled outward, it is the first surface 112a of the ejector 110a that applies a force to the edge of the PC card to be removed.

It is understood that the above description is intended to be illustrative and not restrictive. For example, although in the preferred embodiment the ejection card stop and the recess matching the ejection card stop are rectangular in shape, the ejection card stop and corresponding recess may be any shape other cards besides PCA cards may also be removed using this system and method. The scope of the invention should be determined with reference to the appended claims, along with the full scope of equivalents to which such claims are entitled.

What is claimed is:

1. A printed circuit board assembly card removal system comprised of:
    an ejection card means for removing a printed circuit board from a printed circuit board connection means, wherein the ejection card means includes a first major surface that is generally parallel to a first major surface of the printed circuit board to be removed, the ejection card means including at least a first ejection means, the first ejection means extending from the first major surface of the ejection card means, wherein the distance the first ejection means extends from the first major surface of the ejection card means is greater than or equal the minimum distance separating the ejection card means and the printed circuit board to be removed; and
    a first ejection card holding means for supporting the ejection card means.

2. The card removal system recited in claim 1 further including a second ejection means, the second ejection means extending from the first major surface of the ejection card means, wherein the distance the second ejection means extends from the first surface of the ejection card means is greater than or equal to the minimum distance separating the ejection card means and the printed circuit board and a second ejection card holding means.

3. The card removal system recited in claim 2 wherein the first ejection card holding means and the second ejection card holding means are positioned on either side of the printed circuit board connection means.

4. A printed circuit board assembly card removal system comprised of:
    an ejection card means for removing a printed circuit board connection means including at least a first election means, the ejection card means having a first surface; and
    a first ejection card holding means for supporting the ejection card means wherein the ejection card holder means includes a recess for supporting the first ejection means.

5. A printed circuit board assembly card removal system comprised of:
  an election card means for removing a printed circuit board connection means including at least a first ejection means the ejection card means having a first surface; and
  a first ejection card holding means for supporting the ejection card means, wherein the ejection card holder includes a recess for supporting a first stopping means for stopping the movement of the first ejection card means.

6. A printed circuit board assembly card removal system comprised of:
  an ejection card means for removing a printed circuit board connection means including at least a first ejection means, the ejection card means having a first surface; and
  a first ejection card holding means for supporting the ejection card means, wherein the first major surface of the ejection card means is insulative.

7. The card removal system recited in claim 6 wherein the ejection card means is formed from an insulative material.

8. The card removal system recited in claim 6 wherein the ejection card means includes a first insulative layer, a second insulative layer, and a conductive layer positioned between the first and second insulative layers.

9. The card removal system recited in claim 8 wherein the conductive layer of the ejection card means is electrically coupled to ground.

10. The card removal system recited in claim 1 wherein the ejection card means further includes a stopping means for stopping the movement of the ejection card means.

11. The card removal system recited in claim 1 wherein the ejection card means and ejection card holder means are housed in a system chassis, wherein the system chassis includes a means for aligning the printed circuit board onto the system chassis.

12. A printed circuit board assembly card removal system comprised of:
  an ejection card means for removing a printed circuit board connection means including at least a first ejection means, the ejection card means having a first surface; and
  a first election card holding means for supporting the ejection card means, wherein the ejection card means includes at least a first ejection card gripping means.

13. The card removal system recited in claim 8, further including a card corner alignment means for facilitating alignment of the printed circuit board assembly into the system chassis wherein the card corner alignment system is mechanically attached to the system chassis.

14. A method for removing a printed circuit board assembly from an electrical connector comprising the steps of:
  pulling outwardly on an ejection card so that an ejector applies a force to the printed circuit board assembly to be removed, wherein the ejector extends from a first surface of the ejection card, wherein the distance the ejector extends from the surface of the ejection card is greater than or equal to the distance between the ejection card and the printed circuit board assembly to be removed.

15. The method recited in claim 14, including the step of inserting the ejector into an ejection card holder, wherein the step of inserting the ejector into the ejection card holder occurs before the step of pulling outwardly on the ejection card.

16. The method recited in claim 14, including the step of installing the ejection card stop into the ejection card holder, wherein the step of installing the ejection card stop into the ejection card holder occurs before the step of pulling outwardly on the ejection card.

17. The printed circuit board assembly card removal system recited in claim 1 wherein the first surface of the ejection means is used to apply a force against the edge of the printed circuit board to be removed.

18. The card removal system recited in claim 1 wherein the ejection card holder includes a recess for supporting the first ejection means.

19. The card removal system recited in claim 1 wherein the ejection card holder includes a recess for supporting a first stopping means for stopping the movement of the ejection card means.

20. The card removal system recited in claim 1 wherein the first major surface of the ejection card means is formed from an insulative material.

21. The card removal system recited in claim 1 wherein the ejection card means includes a first insulative layer, a second insulative layer, and a conductive layer positioned between the first and second insulative layers.

22. The card removal system recited in claim 1 wherein the conductive layer of the ejection card means is electrically coupled to ground.

23. The method recited in claim 15, wherein the step of pulling outwardly on the ejection card removes the ejector from a recess in the ejection card holder.

24. The method recited in claim 16, wherein the step of pulling outwardly on the ejection card removes the ejection card stop from a recess in the ejection card holder.

* * * * *